United States Patent [19]
Shields et al.

[11] Patent Number: 6,127,259
[45] Date of Patent: Oct. 3, 2000

[54] PHOSPHORIC ACID PROCESS FOR REMOVAL OF CONTACT BARC LAYER

[75] Inventors: Jeffrey A. Shields, Sunnyvale; Bharath Rangarajan, Santa Clara, both of Calif.

[73] Assignee: Advanced Micro Devices, Inc., Sunnyvale, Calif.

[21] Appl. No.: 09/372,443

[22] Filed: Aug. 11, 1999

[51] Int. Cl.⁷ .................................................. H01L 21/4763
[52] U.S. Cl. ........................ 438/626; 438/636; 438/631; 438/645
[58] Field of Search ..................... 438/597, 626, 438/636, 629, 643, 644, 631, 645, 786; 257/640, 510, 764

[56] References Cited

U.S. PATENT DOCUMENTS

| 5,710,067 | 1/1998 | Foote et al. | 438/636 |
| 5,759,893 | 6/1998 | Wu | 438/254 |

*Primary Examiner*—Charles Bowers
*Assistant Examiner*—Hsien Ming Lee
*Attorney, Agent, or Firm*—Foley & Lardner

[57] ABSTRACT

An anti-reflective coating layer which is used to provide better control over the photolithographic process during the contact masking step is removed using a boiling phosphoric acid bath to reduce the amount of thickness variations that remain after the metal contact is filled in the contact hole and planarized by polishing. As a result, post-polish defect inspections are facilitated.

19 Claims, 3 Drawing Sheets

PHOSPHORIC ACID PROCESS FOR REMOVAL OF CONTACT BARC LAYER

BACKGROUND OF THE INVENTION

1. Field of the Invention

The invention relates generally to a method of forming metal contacts in a semiconductor device, and, more particularly, to a method of removing an anti-reflective coating layer using a phosphoric acid bath to provide a semiconductor device having a more consistent planar surface at the conclusion of the metal contact forming step.

2. Description of the Related Art

Anti-reflective coatings have been used in the fabrication of small dimension integrated circuits (ICs) to provide better control over the photolithographic process. In particular, inorganic BARCs (bottom anti-reflective coatings) have been used during the contact hole masking step to reduce the reflections from the underlying topography substrate and thereby provide better control over the width of the photoresist mask openings which are used to form contact holes of a desired width.

FIGS. 1A–1D illustrate a conventional method of forming metal contacts for a semiconductor device in which an anti-reflective coating layer is used to reduce the reflections from the underlying topography substrate. The semiconductor device includes a substrate 10, an active region 15 formed in the substrate 10, an insulating layer 20, which is typically a silicon dioxide ($SiO_2$) layer, disposed on top of the substrate 10, a BARC layer 30 disposed on top of the insulating layer 20, and a photoresist layer 40 in which mask openings 45 are formed by a conventional photolithographic process.

The semiconductor device illustrated in FIG. 1A is etched to form openings 50 through the BARC layer 30 and the insulating layer 20. FIG. 1B illustrates the semiconductor device having the openings 50 and the photoresist layer 40 removed. On top of the semiconductor device illustrated in FIG. 1B, a metal layer 60, e.g., tungsten (W), is deposited on its surface. The resulting structure is shown in FIG. 1C.

Subsequently, the metal layer 60 is planarized by a conventional polishing process. The metal layer 60 is polished until the entire surface of the BARC layer 30 is exposed and the metal contacts 70 remain. The resulting structure is illustrated in FIG. 1D.

In the conventional method of forming metal contacts, the BARC layer 30 that remains after the metal layer 60 is polished has thickness variations and surface inconsistencies 80 that make post-polish defect inspections extremely difficult. It is thus desirable to provide a semiconductor device having a more consistent planar surface at the conclusion of the metal contact forming step to improve the rate and the quality of post-polish defect inspections.

SUMMARY OF THE INVENTION

The invention provides a method of forming metal contacts in a semiconductor device in which an anti-reflective coating layer used to provide better control over the photolithographic process is removed by phosphoric acid. The removing step may be carried out just after the metal layer for forming the metal contacts has been deposited and polished, or before the metal layer for forming the metal contacts is deposited and polished. The removal of the anti-reflective coating layer in this manner, reduces the amount of thickness variations on the planar surface of the semiconductor device and leads to an improved and less difficult post-polish defect inspection.

BRIEF DESCRIPTION OF THE DRAWINGS

The invention is described in detail herein with reference to the drawings in which.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENTS

Figure 1A:
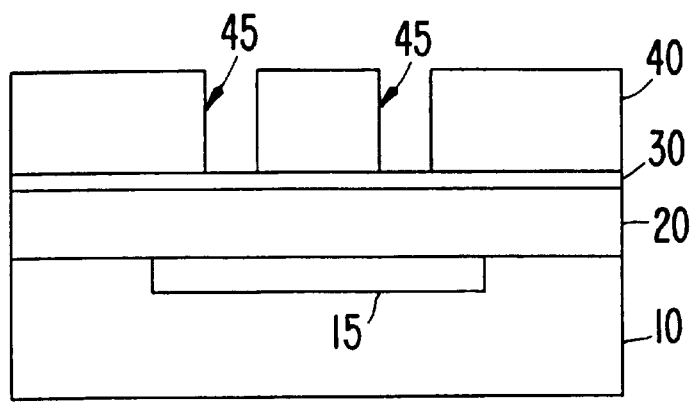
FIGS. 1A–1D illustrate the conventional steps of forming metal contacts in a semiconductor device.
Figure 1B:
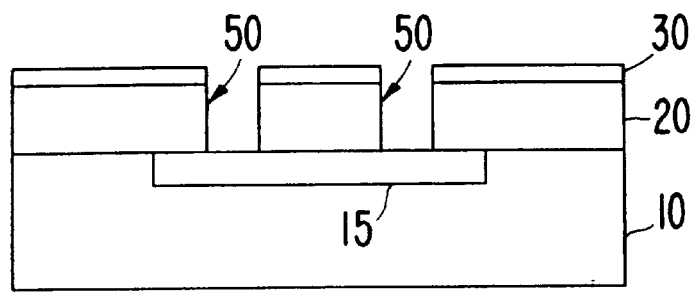
Figure 1C:
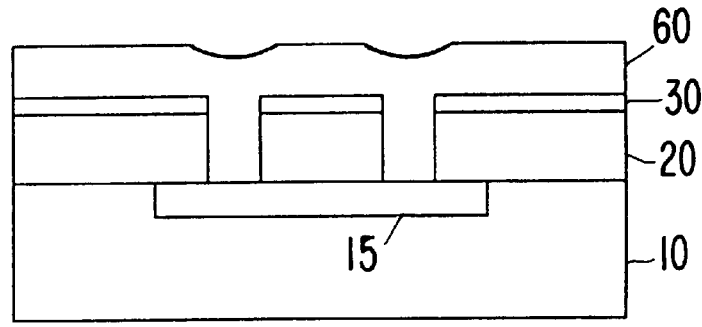
Figure 1D:
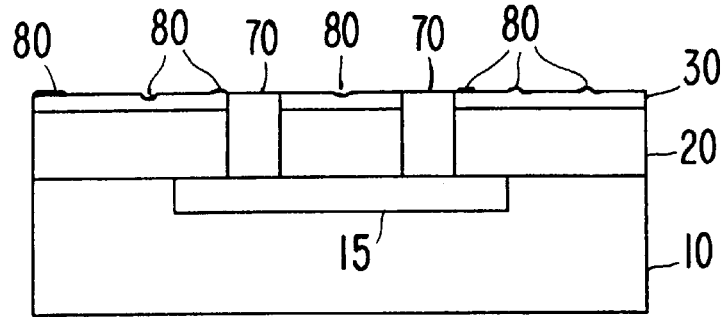
Figure 2A:
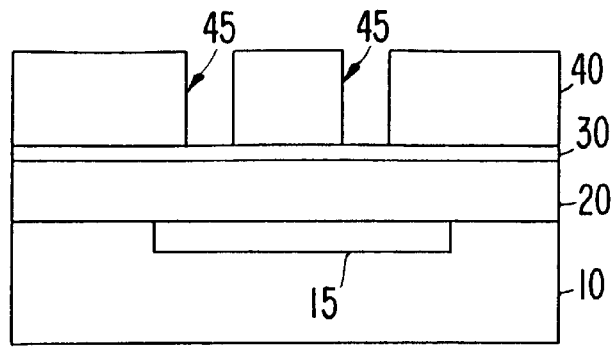
FIGS. 2A–2E illustrate a method of forming metal contacts in a semiconductor device in accordance with a first embodiment of the invention.

FIG. 2A illustrates a semiconductor device having a silicon substrate 10, an active region 15 formed in the substrate 10, an insulating layer 20 (e.g., an $SiO_2$ layer, a thermal oxide layer, a plasma-enhanced chemical vapor deposition (PECVD) oxide layer, a high temperature furnace deposited oxide layer, or the like), formed on top of the substrate 10, an inorganic BARC layer 30, preferably a silicon oxynitride (SiON) layer, formed on top of the insulating layer 20, and a photoresist layer 40 formed on top of the BARC layer 30. Within the photoresist layer 40, mask openings 45 have been formed by a conventional photolithographic process.

Figure 2B:
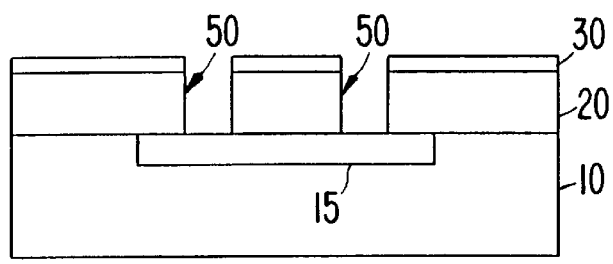

The semiconductor device illustrated in FIG. 2A is subjected to an etchant that removes the BARC layer 30 and the insulating layer 20 at a faster rate than the photoresist layer 40 and the semiconductor substrate 10. This etching process is continued until the substrate 10 is exposed through the openings 50 that are formed through the BARC layer 30 and the insulating layer 20. The photoresist layer 40 is then removed. The resulting structure is illustrated in FIG. 2B.

Figure 2C:
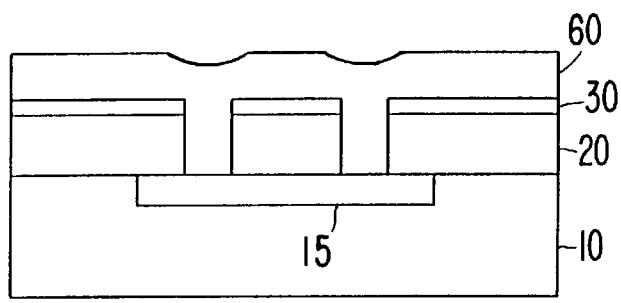

Subsequently, a metal layer 60 is deposited on the surface of the semiconductor device. The metal layer 60 typically includes titanium (Ti), titanium nitride (TiN), and tungsten (W), where Ti is the lowermost layer and W is the uppermost layer, and fills the openings 50. The resulting structure is shown in FIG. 2C. The metal layer 60 is then polished until the entire surface of the BARC layer 30 is exposed and metal contacts 70 are formed. The polishing process is preferably a chemical-mechanical polish (CMP).

Figure 2D:
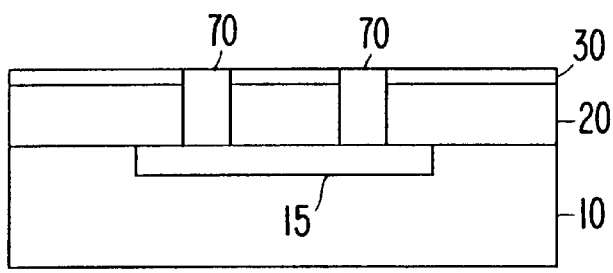

At the conclusion of the polishing step, in accordance with the first embodiment of the present invention, the semiconductor device of FIG. 2D is dipped in a boiling phosphoric acid bath. The temperature of the boiling phosphoric acid is about 150° C.±30° C. The etch rate of the BARC layer 30 boiling phosphoric acid etches the BARC layer 30 at a rate that is much higher than the insulating layer 20, generally about 5–100 times higher depending on the SiON concentration and the insulating layer type. Such a high etch selectivity of the BARC layer 30 with respect to the insulating layer 20 permits good control of the removal of the BARC layer 30 and thereby limits any attack on the insulating layer 20 after the BARC layer 30 has been removed. The semiconductor device having the BARC layer 30 removed is illustrated in FIG. 2E.

Figure 2E:
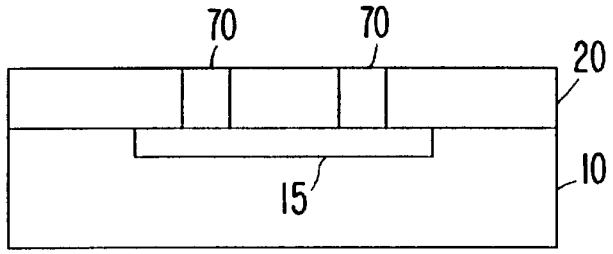

At the conclusion of the BARC layer removing step, an additional polishing step to planarize the upper surface of the semiconductor device illustrated in FIG. 2E may be necessary, because the metal contacts 70 may have etched at a different rate than the BARC layer 30 and consequently a bump or a depression may be formed by the metal contacts 70 along the upper surface of the semiconductor device at the conclusion of the BARC layer removal step.

Further, the where the BARC layer comprises silicon oxynitride, there may be differing amounts of oxygen and nitrogen in its chemical composition, $SiO_xN_y$. For example, it is possible to increase the concentration of nitrogen or decrease the concentration of oxygen in the silicon oxynitride so as to increase its etch rate in the fluorine containing chemistry relative to the underlying insulating layer 20. However, there is an upper limit to an increase of the nitrogen concentration (or decrease in the oxygen concentration) because the increase in the nitrogen concentration (or decrease in the oxygen concentration) increases the internal reflectivity of the BARC layer and thus decreases its level of performance as an anti-reflective coating. In a similar manner, the concentration of nitrogen in the silicon oxynitride layer may be decreased (or the concentration of oxygen increased) to improve its level of performance as an anti-reflective coating so long as its etch rate in the fluorine containing chemistry relative to that of the underlying insulating layer 20 is sufficiently high.

Figure 3A:
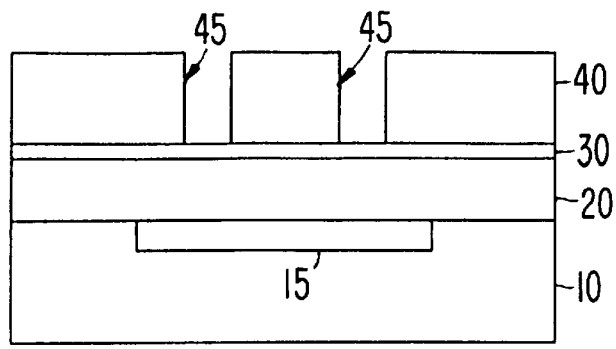
FIGS. 3A–3E illustrate a method of forming metal contacts in a semiconductor device in accordance with a second embodiment of the invention.
Figure 3B:
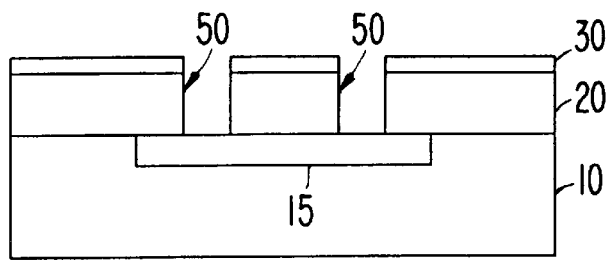

FIGS. 3A–3E illustrate the steps of forming metal contacts in a semiconductor device in accordance with the second embodiment of the invention. The semiconductor device illustrated in FIG. 3A is identical to the semiconductor device illustrated in FIG. 2A, and the steps of forming the openings 50 through the BARC layer 30 and the insulating layer 20, as illustrated in FIG. 3B, are identical as illustrated and explained in connection with FIGS. 2A and 2B.

In this embodiment, however, after the openings 50 are formed, the BARC layer 30 is removed in a boiling phosphoric acid bath. The temperature of the boiling phosphoric acid is about 150° C.±30° C. Under these conditions, a higher etch selectivity of the BARC layer 30 can be achieved with respect to the underlying insulating layer 20 and the exposed active region 15 of the substrate 10, generally about 5–100 times higher depending on the SiON concentration and the insulating layer type. Even though the active region 15 of the substrate 10 is exposed to the phosphoric acid bath, any attack on the exposed active region 15 is limited because of the high etch selectivity of the BARC layer 30 with respect to the underlying insulating layer 20 and the exposed active region 15.

Figure 3C:
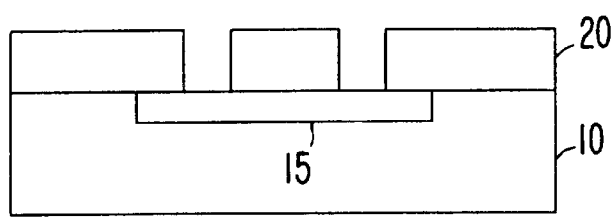
Figure 3D:
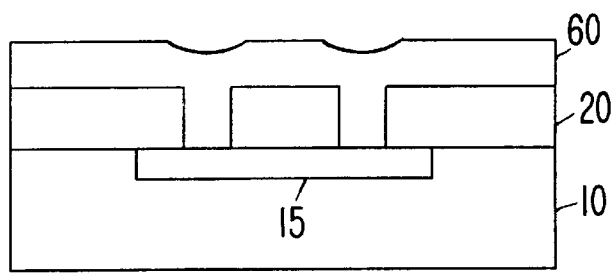
Figure 3E:
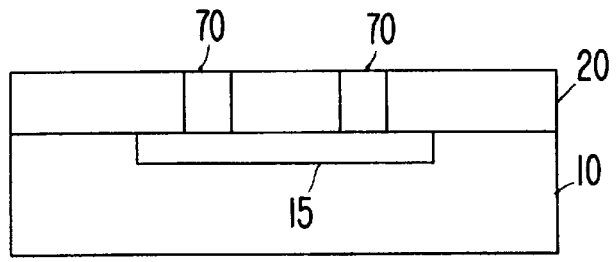

After the BARC layer removing step, a metal layer 60 is disposed on the surface of the semiconductor device illustrated in FIG. 3C. The metal layer is preferably tungsten (W) and is illustrated in FIG. 3D. Thereafter, the upper surface of the metal layer 60 is polished by CMP until an entire surface of the insulating layer 20 is exposed and metal contacts 70 are formed.

In the second embodiment, as in the first embodiment, it is possible to increase the concentration of nitrogen in the silicon oxynitride so as to increase its etch rate in the phosphoric acid bath relative to the underlying insulating layer 20 and the active region 15 of the substrate 10, without significantly increasing its reflectivity to harm its function as an anti-reflective coating. In a similar manner, the concentration of nitrogen in the silicon oxynitride layer may be decreased to improve its level of performance as an anti-reflective coating so long as its etch rate in the phosphoric acid bath relative to those of the underlying insulating layer 20 and the active region 15 of the substrate 10 are sufficiently high.

All particular embodiments according to the invention have been illustrated and described above, it will be clear that the invention can take a variety of forms in embodiments within the scope of the appended claims.

We claim:

1. A method of producing a semiconductor device with a planar upper surface, the semiconductor device having a substrate, an insulating layer above the substrate, and metal contacts formed through the insulating layer, said method comprising the steps of:

forming contact holes through an insulating layer disposed above the substrate and in an anti-reflective coating (ARC) layer disposed above the insulating layer;

depositing a metal layer to fill the contact holes with metal;

polishing an upper surface of the metal layer after said depositing step; and removing the ARC layer by subjecting the semiconductor device to a phosphoric acid bath, said removing step taking place during one of (i) before and (ii) after said depositing step.

2. The method according to claim 1, wherein the step of removing is performed after the step of depositing.

3. The method according to claim 2, further comprising a step of polishing the upper surface of the metal layer a second time after the step of removing.

4. The method according to claim 3, wherein the semiconductor device is subjected to a boiling phosphoric acid bath.

5. The method according to claim 4, wherein the boiling phosphoric acid bath has a temperature of about 150° C.±30° C.

6. The method according to claim 5, wherein the ARC layer comprises silicon oxynitride and further comprising a step of adjusting a concentration of nitrogen or oxygen in the silicon oxynitride.

7. The method according to claim 1, wherein the step of removing is performed before the step of depositing.

8. The method according to claim 7, wherein the semiconductor device is subjected to a boiling phosphoric acid bath.

9. The method according to claim 8, wherein the boiling phosphoric acid bath has a temperature of about 150° C.±30° C.

10. The method according to claim 9, wherein the ARC layer comprises silicon oxynitride and further comprising a step of adjusting a concentration of nitrogen or oxygen in the silicon oxynitride.

11. A method of producing a semiconductor device with a planar upper surface from a semiconductor substrate having a substrate, an active region formed in the substrate, an insulating layer disposed on top of the substrate, and an anti-reflective coating (ARC) layer disposed on top of the insulating layer, said method comprising the steps of:

disposing a photoresist layer on top of the ARC layer;

forming openings in the photoresist layer to expose portions of the ARC layer;

etching openings through the ARC layer and the insulating layer at locations corresponding to the openings in the photoresist layer;

depositing metal into the openings formed in insulating layer;

polishing the metal after said depositing step until an entire upper surface of the ARC layer is exposed; and removing the ARC layer after said polishing step to planarize the upper surface of the semiconductor device by exposing the semiconductor device to a phosphoric acid bath.

12. The method according to claim 11, further comprising a step of polishing the upper surface of the semiconductor device after the ARC layer has been removed.

13. The method according to claim 12, wherein the phosphoric acid is boiling.

14. The method according to claim 13, wherein, during the step of exposing, the boiling phosphoric acid has a temperature of about 150° C.±30° C.

15. The method according to claim 11, wherein the ARC layer comprises silicon oxynitride and further comprising a step of adjusting a concentration of nitrogen or oxygen in the silicon oxynitride.

16. A method of producing a semiconductor device with a planar upper surface from a semiconductor substrate having a substrate, an active region formed in the substrate, an insulating layer disposed on top of the substrate, and an anti-reflective coating (ARC) layer disposed on top of the insulating layer, said method comprising the steps of:

disposing a photoresist layer on top of the ARC layer;

forming openings in the photoresist layer to expose portions of the ARC layer;

etching openings through the ARC layer and the insulating layer at locations corresponding to the openings in the photoresist layer;

removing the ARC layer after said etching step by exposing the semiconductor device to a phosphoric acid bath;

depositing metal into the openings formed in insulating layer after said removing step; and polishing the metal until an entire upper surface of the insulating layer is exposed.

17. The method according to claim 16, wherein the phosphoric acid is boiling.

18. The method according to claim 17, wherein, during the step of exposing, the boiling phosphoric acid has a temperature of about 150° C.±30° C.

19. The method according to claim 18, wherein the ARC layer comprises silicon oxynitride and further comprising a step of adjusting a concentration of nitrogen or oxygen in the silicon oxynitride.

* * * * *